US008655802B2

(12) United States Patent
Mace et al.

(10) Patent No.: US 8,655,802 B2
(45) Date of Patent: Feb. 18, 2014

(54) METHOD OF DOWNLOADING USAGE PARAMETERS INTO AN APPARATUS, AND APPARATUS FOR IMPLEMENTING THE INVENTION

(75) Inventors: Philippe Mace, Rennes (FR); Luc Roux, Severac (FR); Angelo Mazzante, Melesse (FR)

(73) Assignee: Thomson Licensing (FR)

( * ) Notice: Subject to any disclaimer, the term of this patent is extended or adjusted under 35 U.S.C. 154(b) by 1126 days.

(21) Appl. No.: 12/312,317

(22) PCT Filed: Oct. 30, 2007

(86) PCT No.: PCT/EP2007/061702
§ 371 (c)(1),
(2), (4) Date: May 5, 2009

(87) PCT Pub. No.: WO2008/055822
PCT Pub. Date: May 15, 2008

(65) Prior Publication Data
US 2010/0042562 A1  Feb. 18, 2010

(30) Foreign Application Priority Data
Nov. 9, 2006  (FR) .................................. 06 54809

(51) Int. Cl.
G06F 15/18  (2006.01)
(52) U.S. Cl.
USPC .......................................................... 706/12
(58) Field of Classification Search
USPC .......................................................... 706/12
See application file for complete search history.

(56) References Cited

U.S. PATENT DOCUMENTS

| 5,761,085 | A  | * | 6/1998  | Giorgio .......................... 702/33 |
| 6,390,379 | B1 |   | 5/2002  | Huang |
| 6,477,485 | B1 |   | 11/2002 | Radulovic et al. |
| 6,850,252 | B1 | * | 2/2005  | Hoffberg ...................... 715/716 |
| 7,651,034 | B2 | * | 1/2010  | Weimer et al. .................. 236/11 |
| 2003/0011984 | A1 |   | 1/2003  | Chu et al. |
| 2004/0199573 | A1 | * | 10/2004 | Schwartz et al. ............. 709/201 |
| 2004/0230797 | A1 | * | 11/2004 | Ofek et al. .................... 713/168 |
| 2005/0004861 | A1 |   | 1/2005  | Bancroft |
| 2005/0080700 | A1 |   | 4/2005  | Bancroft |
| 2005/0244263 | A1 | * | 11/2005 | Hardt et al. ..................... 415/47 |
| 2006/0049268 | A1 | * | 3/2006  | Weimer et al. .................. 236/51 |
| 2006/0241801 | A1 |   | 10/2006 | Haaks et al. |
| 2007/0038547 | A1 |   | 2/2007  | Bancroft |

FOREIGN PATENT DOCUMENTS

FR           2816078         5/2002
WO    WO 2004/109885     12/2004

OTHER PUBLICATIONS

Search Report Dated Jan. 22, 2008.

* cited by examiner

Primary Examiner — Kakali Chaki
Assistant Examiner — Ababacar Seck
(74) Attorney, Agent, or Firm — Tutunjian & Bitetto, P.C.

(57) ABSTRACT

After a first start-up, a first appliance performs a self-learning step for generating usage parameters. These parameters are elaborated on subsequent start-ups. When these parameters are optimized, the first appliance transmits them to another appliance which requests them. This second appliance uses the parameters of the first as optimized parameters. In this way, the second appliance limits the duration of the self-learning step and the use of non-optimal parameters. According to a refinement, the optimal parameters are centralized on a server which transmits them to a plurality of second appliances using a transmission network.
The present invention also relates to an appliance and a server implementing the method.

16 Claims, 3 Drawing Sheets

Figure 1:
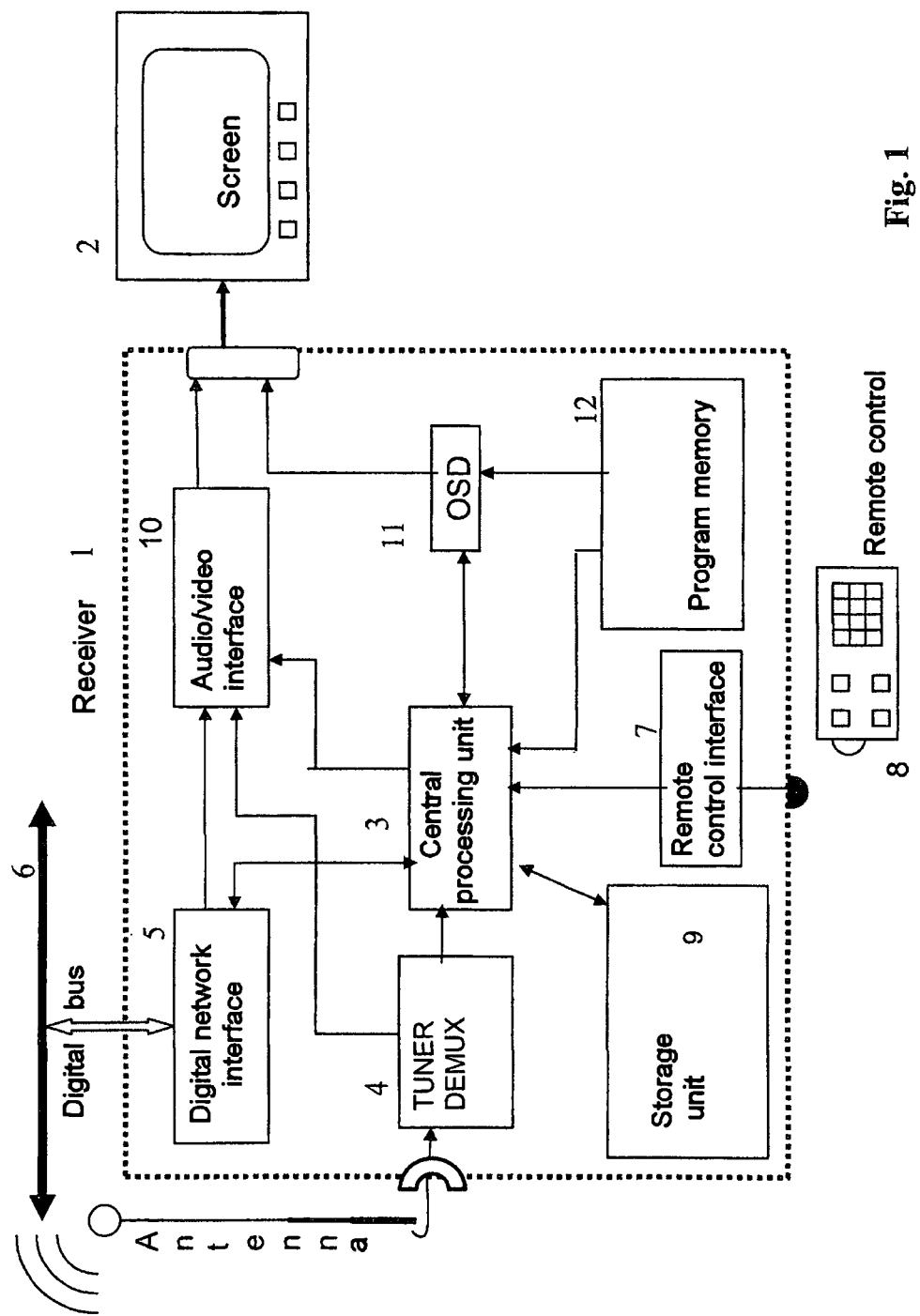

METHOD OF DOWNLOADING USAGE PARAMETERS INTO AN APPARATUS, AND APPARATUS FOR IMPLEMENTING THE INVENTION

This application claims the benefit, under 35 U.S.C. §365 of International Application PCT/EP2007/061702, filed Oct. 30, 2007, which was published in accordance with PCT Article 21(2) on May 15, 2008 in French and which claims the benefit of French patent application No. 06 54809, filed Nov. 09, 2006.

The present invention relates to a method of downloading usage parameters to an appliance, and an appliance for implementing the invention.

These days, numerous appliances can be used to receive and play back recorded audiovisual works. Recently, high-capacity hard disks have been incorporated in these audiovisual receivers; these can store the contents downloaded either from a unidirectional transmission network or from a point-to-point network (Internet for example). The appliances have powerful equipment with which to perfectly satisfy the needs of the user. This flexibility of use results from executable programs capable of analyzing the behavior of the user. For example, when a user frequently selects certain television channels, the receiver can assemble them into a list of favorite channels, and thus enable that user to access these channels more easily.

With respect to the hardware, the electrical appliances are heavy energy consumers. This energy is converted into heat which is concentrated inside. If it is not released, this heat causes accelerated aging of the electronic components, ending in irreversible deterioration. To avoid this, the manufacturers cut ventilation openings into the housing of the appliance to enable the hot air to be released. A fan is arranged close to the openings to speed up the transfers with the external environment and improve the cooling. However, the use of a fan at full speed is noisy, so that the appliance manufacturers have put in place a servo control system which modulates the control according to a temperature measurement. In this way, the fan runs at a speed that is just sufficient to ensure good cooling with a minimum sound level. The servo control system is a standard software program that has to be adapted to each appliance. This adaptation can be done in the laboratory; to do this, the technician switches on the appliance, analyses its operation using measuring instruments and defines usage parameters. However, these adjustments are made on new equipment and in particular conditions which are not necessarily tailored to the place where the appliance will ultimately be used. Furthermore, these parameters can evolve after a certain period of use. This is why the manufacturers have provided the appliances with a self-learning function. Initially, the appliance uses the default parameters defined in the laboratory. Then, by analyzing its operation, the appliance modifies these parameters in order to improve its operation. On subsequent power-ups, it is the new parameters that are used.

The self-learning function makes it possible to generate optimal usage parameters, but it requires each appliance to perform its own self-learning. During the self-learning step, the values of the parameters are refined to make them optimal. The present invention makes it possible in particular to reduce the time it takes for an appliance to have parameters with optimal values.

Document WO 2004/109885 filed by SIEMENS describes an electronic fuse which is tripped following a set-point dependent on a reference value supplied by a self-learning step. The self-learning step consists in analyzing the voltage during a given time window, and the values measured in this way are stored and analyzed. Then, a benchmark is set and transferred via a communication network to other systems using electronic fuses. This document teaches the generation of parameters over a long period of use, but provides no solution for parameters elaborated during a succession of several start-ups.

Document U.S. Pat. No. 5,761,085 filed by GIORGIO PAUL describes a network that can be used to manage variable parameters between multiple appliances. It is possible to transmit to another appliance, for example, a fan control parameter, for said fan not to make too much noise. According to this document, the parameter is requested by the other appliance in order to run a value check and so make it possible to detect failures. Because of this, the parameter cannot usefully serve other appliances.

One subject of the present invention is a method of downloading usage parameters, the method comprising a self-learning step executed over a plurality of start-ups in order to generate new usage parameters on a first appliance; the method is characterized in that it also comprises:

after the plurality of start-ups for generating new usage parameters, a step for transmitting the new usage parameters from the first appliance to at least one second appliance, a step for using the new usage parameters downloaded into the second appliance, replacing those being generated in a self-learning step executed on said second appliance.

In this way, the new parameters elaborated by a first appliance can be used by a second appliance, this second appliance not needing to conclude a complete self-learning step. In this way, the second appliance uses new parameters just after the download. Thus, the new parameters are obtained more quickly on the second appliances. Such parameters can be used to program the starting-up of a fan, or the partitioning of the working memory.

According to a first refinement, the parameter transmission step is performed after a predetermined number of start-ups of the first appliance. In this way, the receiver simply determines the moment when it transmits the parameters generated during the self-learning step. According to another variant, the parameter transmission step is performed when the variation in the values of the parameters generated between one switch-on and those of the next switch-on is less than a predetermined ratio. In this way, when the new parameters stop changing or change very little, they are considered to be optimum and can be downloaded. According to another variant, the parameter transmission step is performed when the overall duration of use of the appliance reaches a predetermined duration. In this way, when the appliance is used for at least a certain time, certain usage parameters can be considered to be optimum.

According to another refinement, the appliance type and the usage parameters generated from an appliance of this type are transmitted. In this way, the second appliance can receive usage parameters from a first appliance of the same type. According to another refinement, the usage parameters originating from the first appliances are transmitted to a server, said server transmitting them to at least one second appliance in response to a request from the latter. In this way, the appliance centralizes the received parameters and transmits them to those that request them. According to another refinement, the server modifies the received parameters before sending them to at least one second appliance. Modifying the parameters consists in calculating the average of the received values or adding a predetermined value to the received values. In this way, the server can determine average values or add a safety margin before transmitting the parameters to the appliances that request them. According to another refinement, the server transmits the parameters over a unidirectional network. In this way, the second appliances do not need to request them, or to set up a point-to-point link between themselves and the server.

According to another refinement, the receiver stores parameters used on a first power-up, then a step for requesting usage parameters elaborated by a second appliance is initiated in order to replace the default parameters that have just been used. In this way, a receiver has a standalone mode of operation and does not necessarily need usage parameters to be transmitted to it.

Another subject of the present invention is an electronic server comprising a means of communicating with a plurality of electronic appliances, characterized in that it comprises a means of receiving new usage parameters elaborated by a first appliance after a plurality of start-ups, a means of storing said new received parameters, and a means of transmitting at least part of the new stored parameters to at least one second appliance.

Another subject of the present invention is an electronic appliance comprising a means of generating new usage parameters during a self-learning step, said new parameters being elaborated after a plurality of start-ups, characterized in that it comprises a means of transmitting said new usage parameters to a server at a predetermined moment.

Figure 2:
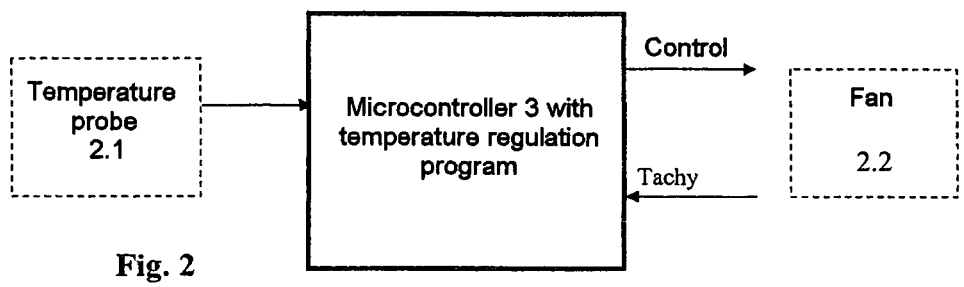
Figure 3:
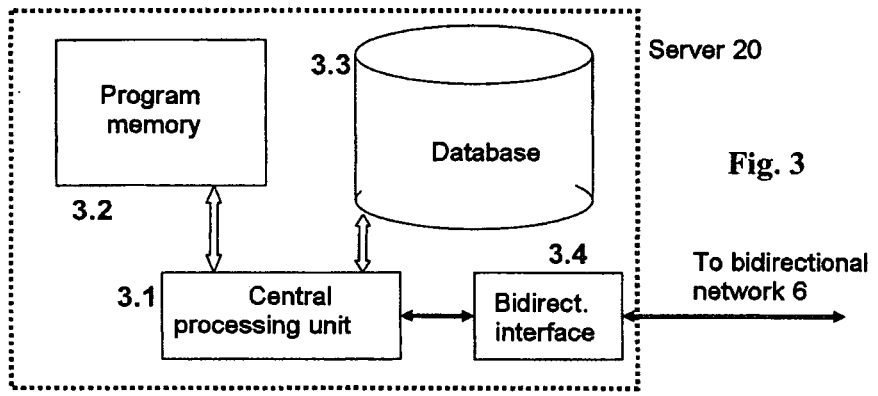
Figure 4:
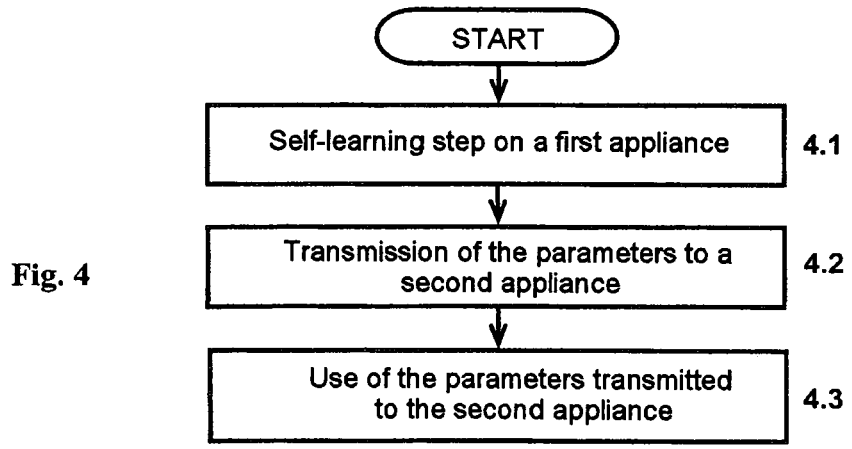
Figure 5:
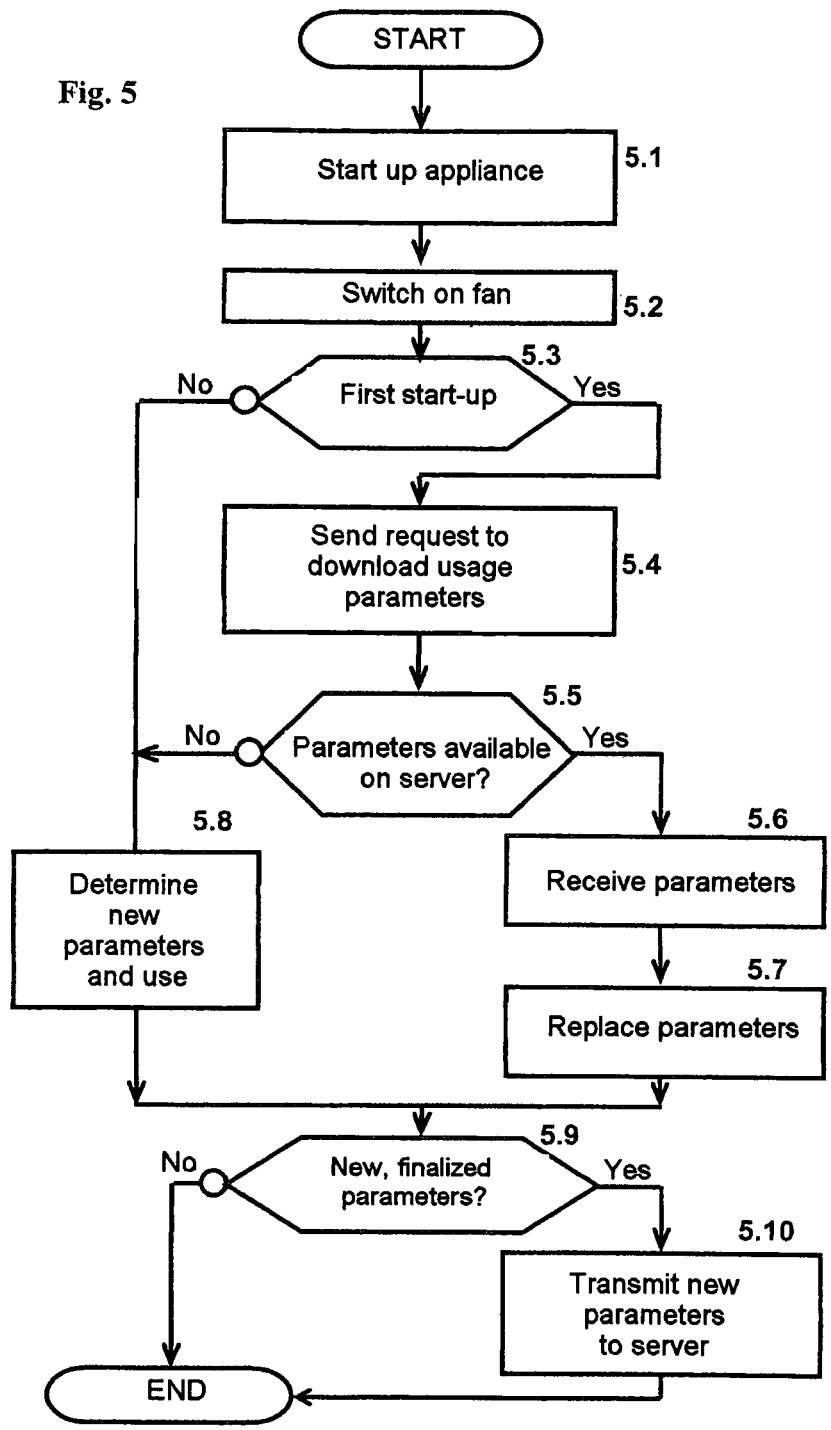

Other characteristics and advantages of the present invention will become apparent from the description of the exemplary embodiments given below, taken as no limiting examples, with reference to the appended figures in which:

FIG. 1 is a block diagram of an audiovisual receiver for implementing the invention, FIG. 2 is a diagram showing the different elements of a server according to the invention, FIG. 3 is a diagram of an exemplary servo control system using the present invention, FIG. 4 shows the main steps of the method according to one exemplary embodiment, FIG. 5 shows a detailed flow diagram of the steps of the method according to one exemplary embodiment.

The operation of an audiovisual receiver 1 provided with a display device 2 will be described first. The receiver comprises a central processing unit 3 linked to a program memory 12, and an interface 5 for communication with a high-speed local digital bus 6 enabling audio/video data to be transmitted in real time. This network is, for example, an IEEE 1394 network or a USB bus enabling communication with a computer. The receiver 1 can equally receive analogue and/or digital data, for example images or service information, from a transmission network via a reception antenna associated with a demodulator 4. The receiver also comprises an infrared signal receiver 7 for receiving the signals from a remote control 8, a memory 9 for storing the downloaded data, and an audio/video decoding logic 10 for generating the audiovisual signals sent to the television screen 2. According to one exemplary embodiment, the memory 9 is a high-capacity hard disk enabling audiovisual documents to be stored. The receiver also comprises a circuit 11 for displaying data on the screen, often called OSD (On Screen Display) circuit. The OSD circuit 11 is a text and graphics generator which can be used to display menus, pictograms (for example, a number corresponding to the channel being viewed) on the screen, and which makes it possible to display the configuration menus. The digital bus 6 and/or the transmission network transmit data to the receiver 1, such as audiovisual documents, descriptive data or even usage data concerning the receiver 1.

On power-up, the software program stored in the memory 12 is executed and initializes all the receiver's circuits, and then the high-level applications are loaded and take over control. The circuits as a whole consume a lot of energy and give off heat; for example, the central processing unit of the receiver gives off approximately 6 watts of energy. Because of this, the receiver is provided with a fan (not shown in FIG. 1) and openings cut into the housing of the receiver to ensure a constant flow of air.

FIG. 2 illustrates a servo control system according to one preferred exemplary embodiment. This figure is applicable to any regulation system which, receiving a measurement value and according to a set point value, determines a control value. A temperature probe 2.1 and a fan 2.2 are connected to the central processing unit 3. This component has at least one analogue input for receiving signals from the temperature probe 2.1, a digital input for receiving signals representative of the speed of the fan 2.2 (these signals are normally called "Tachy") and a command output for controlling this fan 2.2. According to the measurement supplied by the probe 2.1, the central processing unit 3 calculates the speed of the fan to create a flow of cool air to keep the interior of the receiver 1 below a nominal temperature. According to one preferred exemplary embodiment, the fan is controlled by a PWM (PWM standing for Pulse-Width Modulator) type analogue signal. A PWM signal is a periodic digital signal which, when converted into an analogue signal by using a low-pass filter, can be used to control the rotation speed of the fan. The frequency of the signal is fixed, the central processing unit 3 varies the duty cycle. This variation of the duty cycle makes it possible to vary the amplitude of the analogue signal controlling the motor. In the exemplary embodiment, the duty cycle of the PWM signal is encoded on 8 bits which corresponds to a value between 0 and 255. Trial and error has shown that the control range of the motor, on this PWM scale, varies from 120 to 180. A variation of one PWM unit is therefore not negligible, which explains why such a variation can be wide. The analogue DC voltage applied varies typically between 0 and 12 volts. The Tachy signal is pulsed, and the number of pulses per unit of time determines the actual speed of the fan.

There is a close correlation between the decibels emitted by the fan and its speed. This speed value is an intermediate parameter because the command actually sent to the fan depends on the servo control system. This speed value is the basis of the measured sound volume. For a certain speed, the noise seems to be well controlled, and, if this speed is deviated from, the noise is modified significantly. A regulation directly controlling the motor according to the temperature could ensure a constant temperature, but the speed variations would be acoustically perceptible, and, in some cases, the command would need to be at maximum which would trigger noisy continuous operation. Because of this, the fan is controlled by a servo control system linked to the speed using different temperature ranges. Each range is associated with a constant speed set point. These ranges are chosen so that the speed set point is modified infrequently.

According to the temperature measured in the appliance, a rotation speed is determined by the central processing unit 3. The set point speed is determined according to temperature ranges. The regulation system measures the current speed of the fan to determine the difference relative to the set point speed. The central processing unit 3 varies the voltage applied to the motor to approach the set point speed. For this, a function is defined which determines the new control value V according to the difference. This function uses a PID (Proportional, Integral, and Differential) type regulation which uses three terms aiming to provide optimal regulation. The proportional term is used to arrive quickly at the set point value. The integral term is used to compensate for any residual error. The differential term avoids or reduces the oscillations that occur when, because of the inertia of the system, the measured value exceeds the set point to be reached. The coefficients $K_P$, $K_I$ and $K_D$ of each term are computed by self-learning by analyzing the measurements made by the probe.

The receiver 1 can communicate via the digital bus 6 with a server 20, a preferred embodiment of which is described in FIG. 3. The server 20 comprises a central processing unit 3.1, a memory 3.2, a logic for formatting usage data 3.3 for downloading said data and a communication interface providing a plurality of bidirectional links 3.4 via the network 6 with the receivers described previously. The memory 3.2 contains the executable program and usage data of at least one receiver 1 communicating via the network 6.

Having described the various elements of the invention, there now follows an explanation of how these cooperate, by one exemplary embodiment.

FIG. 4 illustrates one example of the downloading method. Firstly (step 4.1), a first appliance executes a self-learning step. This first appliance elaborates a certain number of usage parameters over a plurality of start-ups in order to generate parameters enabling optimal use of at least one function of the appliance. In the step 4.2, once these usage parameters have been generated, they are transmitted to a second appliance. In the step 4.3, this second appliance uses these parameters instead of its own usage parameters currently being generated. In this way, the second appliance benefits from the learning of the first and more rapidly obtains powerful usage parameters. In this simple embodiment diagram, the link between the first and second appliances is direct, provided by a USB port for example. In this case, there is no need for a server to be placed between the appliances.

A more detailed diagram of one exemplary embodiment is the flow diagram in FIG. 5. This example is applied to the fan switch-on parameters. Firstly (step 5.1), the receiver 1 is switched on, immediately the servo control system switches on the fan using the default parameters defined in the laboratory (step 5.2). These parameters are:
 a set point value deduced from the value currently given by the temperature probe, or, according to a variant, a range establishing a set point minimum and maximum value,
 a set of coefficients $K_P$, $K_D$ and $K_I$ for each term of the PID regulation,
 a step value defining the difference on the set point between one power-up and the next making it possible to determine the best value for the fan to reach its nominal speed.

Then, in the step 5.3, the receiver 1 tests whether it is a first switch-on. If it is, it is in the interest of the receiver to ask the server to send it detailed parameters. The receiver 1 then sends a usage parameter download request to the server 20 via the digital network 6 (step 5.4). In the step 5.5, the server tests whether these parameters are available, that is, if previously another receiver has sent it detailed parameters. If this data is available, the server transmits it to the receiver 1 (step 5.6). Once the data is received, the receiver stores it and uses it as new parameters on next power-up (step 5.7). If the server responds to the effect that the data is not available, then the receiver must apply a self-learning step to calculate the usage parameters itself (step 5.8). According to a simple exemplary embodiment illustrated by FIG. 5, the receiver 1 asks the server for the usage data on first power-up. A refinement consists in having the receiver ask the server if usage parameters are available as long as the usage parameters are not optimum. In this way, if parameters are downloaded, the duration of the self-learning step is reduced.

During the self-learning step, the servo control system analyses the measurements made on switching on the fan, determines the differences with the predicted value and, if necessary, defines a new set point value and an adjustment of the coefficients $K_P$, $K_D$ and $K_I$. On next power-up, these new parameters will be taken into account.

It can therefore be seen that if usage data is transmitted, the receiver 1 takes no account of the measurements made on first power-up. In practice, the generation of new usage parameters requires multiple power-ups. Because of this, the act of using on second power-up parameters supplied by a server and presumed optimal avoids the use of parameters that are not finely established.

The use of downloaded parameters does not free the receiver of having to check their uses. In the case of the fan, the mechanical characteristics can change over time, so it is necessary to continually check its operation, in particular when it is switched on, and, if necessary, correct the parameters used on subsequent switch-ons. After a certain usage time, the values of the new parameters diverge widely from one appliance to another because of aging, so it is then not desirable to communicate them to the server because there would be a risk of transmitting them to a totally new appliance.

Let us imagine that several power-ups have been performed without the receiver 1 having received usage parameters, either from the bidirectional network 6, or from the transmission network. In this case, the receiver 1 has had time to generate optimal usage parameters, using the servo control system.

The fan is typically controlled by a PWM output modulated according to an 8-bit value supplied by the central processing unit 3. Tests have shown that the control can vary from 115 to 255, and that, to guarantee starting on power-up, it is necessary to apply approximately the value 170 for a short duration. This value makes it possible to start the fan but the latter will very quickly become noisy, so that after a period of 1 to 5 seconds, the servo control system will lower the control to a value between 130 and 140. The servo control system analyses the increase in the speed of the fan and starts to lower the startup control value. Normally, after one to five seconds after power-up, the value applied on startup is located between 130 and 140. For example, on a series of power-ups, the servo control system has controlled the fan with the following values:

170, 138, 127, 136, 132, 135

At a given moment, this data becomes optimal (step 5.9), the receiver then transmits it to the server 20 (step 5.10). The server 20 stores it in its memory 3.3. In the case of the fan switch-on parameters, the usage parameters are generated according to the temperature. Because of this, the parameters previously listed are accompanied by the measured temperature value. If the receiver 1 needs to be placed on other appliances, it is already hot on power-up, whereas if isolated in a cold room, its temperature is lower, and the set point to be applied is different. Advantageously, the server 20 stores a table of usage parameters, according to a variable deduced by the receiver 1, the temperature in this case. According to the variable, the server extracts from the table the corresponding usage parameters. If another receiver sends a usage parameter download request, the server 20 sends it the parameters that the first receiver 1 has previously transmitted to it. Thus, the other receivers can, during their first power-ups, benefit from the experience acquired by another identical receiver, in the same conditions of use. Advantageously, the server that has received a certain number of data items originating from a population of receivers selects the minimum and maximum values of certain parameters and sends them to the receivers that request them. According to the safety constraints of a receiver, said receiver can use the value in the middle of the range, or the minimum value or the maximum value.

The predetermined moment for transmitting usage parameters occurs when these parameters no longer vary, or when their variations from one start-up to the next are less than a predetermined threshold, typically when the variation is less than 5%. To determine this moment, the servo control system compares the differences between the new parameters generated compared to the parameters used for the last power-up. If they almost match, the receiver 1 downloads via the digital network 6 the latest parameters generated. A variant of how to determine the moment when to download the parameters consists in transmitting the usage parameters after a predetermined number of power-ups. Experience has shown that after ten power-ups, the fan switch-on parameters scarcely vary at all. This number 10 is entered into the servo control system and is common to all the receivers of one and the same type.

A refinement consists in having the receiver transmit its type and its model at the same time as its usage parameters. In this way, the server stores in a table the parameters according to the model and the type of appliance sending said parameters. When the server 20 receives a request for parameters from another appliance, said appliance transmits its model and its type and thus receives perfectly suitable parameters, because they are generated by an identical appliance. For example, the sending appliance transmits, with the usage parameters, its type and model identifier "THOMSON DCI 1000-V1".

The set point value and the coefficients $K_P$, $K_D$ and $K_I$ are examples of usage parameters. There are other examples of parameters produced by a self-learning step. The sizes of the different working memories of the receiver 1 are another example of parameters. In an audiovisual receiver, a set-top box for example, the working memory is divided into a certain number of areas such as:

dynamic memory for receiving data,
dynamic decryption memory,
area allocated to service information.

These different areas have a default size defined in the laboratory. Subsequently, the operating system modifies the size of these areas according to the use made of them. For example, if after a hundred hours of operation the area allocated to service information is filled while the receive buffer is only half used, the system modifies the pointers delimiting the memory to increase the size of the area allocated to service information. Usage parameters of this type are preferably transmitted after a certain period of use, at least a hundred hours.

According to a refinement, and in the case of certain usage parameters, when the server has received a number of parameter values originating from different receivers, it calculates an average over some of these parameters. This is particularly effective for the sets of coefficients $K_P$, $K_D$ and $K_I$ of the servo control system. Typically, in the case of the parameter specifying the size of the working memory allocated to certain tasks, it is preferable to average the different values so that overall they will be appropriate to a maximum number of receivers.

According to another refinement which can, if necessary, be combined with the preceding one, the server 20 modifies the value of the parameter received according to a predetermined ratio, in order to allow a safety margin, typically 10%. In the case of the starting of the fan, to be sure that the fan will start up, the server increases the set point value by 10%. For example, if a receiver 1 has transmitted the value 100 over 255 to the server as set point parameter, the server sends 110/255 to the receivers requesting usage parameters. This margin makes it possible to allow for the spread of mechanical characteristics from one fan to another.

According to another refinement, the server chooses either the minimum value out of all the values transmitted, or the maximum value.

According to another refinement, the server 20 transmits the usage parameters over the transmission network. The parameters are then encapsulated in data packets with a specific header. This refinement limits the point-by-point communications with the server 20. The parameters are transmitted cyclically. Typically, these parameters are transmitted repetitively in a loop, for example every 5 minutes. When a receiver 1 has transmitted its usage parameters to the server, the server sends these parameters over the transmission network. If a program needs one or more usage data items and if this program is downloaded into the different receivers by the transmission network, then the transmitter can directly update the program with the latest usage data transmitted. For this, just before transmission, the transmitter replaces the default values with those transmitted by the receivers that have already carried out self-learning steps.

The fact that a receiver has benefited from the reception of usage parameters does not prevent its operation from being constantly tested. If, after a certain period of use, or after a certain number of uses, the parameter values change beyond a certain proportion, they are again downloaded to the server 20, indicating that it is a second download. These second values are taken into account by the server to establish the safety margin associated with the first values transmitted. In a given installed base of receivers, there can be disparities leading to significant value differences. Because of this, the solution involving averaging the values received on the server before transmitting them to other receivers is particularly advantageous.

People skilled in the art can adapt the present invention to numerous other specific forms without departing from the scope of the invention as claimed. In particular, the learning module can determine the values of any physical quantity used in any type of electronic appliance. Consequently, the present embodiments should be considered to be illustrative but can be modified in the field defined by the scope of the appended claims.

The invention claimed is:

1. Method of downloading usage parameters, the method comprising a self-learning step executed over a plurality of appliance power-ups in order to generate new usage parameters on a first appliance; wherein the method comprises:

after the plurality of appliance power-ups for generating new usage parameters and when the values of usage parameters from one power-up to the next no longer vary, a step for transmitting the new usage parameters from the first appliance to at least one second appliance, a step for using the new usage parameters downloaded into the second appliance, replacing those being generated in a self-learning step executed on said second appliance.

2. Method of downloading usage parameters according to claim 1; wherein the parameter transmission step is performed after a predetermined number of power-ups of the first appliance.

3. Method of downloading usage parameters according to claim 1; wherein the parameter transmission step is performed when the variation in the values of the parameters generated between one switch-on and those of the next switch-on is less than a predetermined ratio.

4. Method of downloading usage parameters according to claim 1; wherein the parameter transmission step is performed when the overall duration of use of the first appliance reaches a predetermined duration.

5. Method of downloading usage parameters according to claim 1; wherein it comprises a step for sending the parameters from the first appliance to a server storing said parameters and a step for transmitting said parameters from the server to at least one second appliance.

6. Method of downloading usage parameters according to claim 5; wherein it comprises, between the reception of the parameters originating from first appliances and the transmission of the stored parameters to at least one second appliance, a step for modifying the value of one or more parameters, consisting in calculating the average of the received values.

7. Method of downloading usage parameters according to claim 5; wherein it comprises, between the reception of the parameters originating from first appliances and the transmission of the stored parameters to at least one second appliance, a step for modifying the value of one or more parameters, consisting in adding a predetermined value to the received values.

8. Method of downloading usage parameters according to claim 5; wherein it comprises a step for repetitively transmitting over a unidirectional network the parameters originating from a first appliance, modified or not.

9. Electronic server comprising a means of communicating with a plurality of electronic appliances, wherein it comprises a means of receiving new usage parameters elaborated during a self-learning step by a first appliance after a plurality of appliance power-ups and when the values of usage parameters from one power-up to the next no longer vary, a means of storing said new received parameters, and a means of transmitting at least part of the new stored parameters to at least one second appliance.

10. Electronic server according to claim 9, wherein the means of transmitting at least part of the new stored parameters consists in sending them over a unidirectional transmission network.

11. Electronic server according to claim 9, wherein before sending them, the server modifies the value of one or more parameters by calculating the average of the usage parameter values elaborated by the first appliance.

12. Electronic server according to claim 9, wherein, before sending them, the server modifies the value of one or more parameters by adding a predetermined value to the usage parameter values elaborated by the first appliance.

13. Electronic appliance comprising a means of generating new usage parameters during a self-learning step, said new parameters being elaborated after a plurality of appliance power-ups, wherein it comprises a means of transmitting said new usage parameters to a second appliance after a plurality of power-ups and when the values of usage parameters from one power-up to the next no longer vary.

14. Electronic appliance according to claim 13, wherein the predetermined moment occurs on a predetermined number of power-ups.

15. Electronic appliance according to claim 13, wherein the predetermined moment occurs when the variation in the values of the parameters generated between one power-up and those of the next power-up is less than a predetermined ratio.

16. Electronic appliance according to claim 13, wherein the predetermined moment occurs when the total duration of use of the appliance reaches a predetermined duration.

* * * * *